United States Patent
Jung et al.

(10) Patent No.: US 7,821,845 B2
(45) Date of Patent: Oct. 26, 2010

(54) WRITE DRIVER CIRCUIT OF AN UNMUXED BIT LINE SCHEME

(75) Inventors: Jong-hoon Jung, Seoul (KR); Chan-ho Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 259 days.

(21) Appl. No.: 12/184,321

(22) Filed: Aug. 1, 2008

(65) Prior Publication Data

US 2009/0034348 A1    Feb. 5, 2009

(30) Foreign Application Priority Data

Aug. 2, 2007  (KR) .................... 10-2007-0077809

(51) Int. Cl.
*G11C 7/10* (2006.01)

(52) U.S. Cl. ............................. 365/189.05; 365/230.06

(58) Field of Classification Search ............ 365/189.05, 365/230.06, 203
See application file for complete search history.

(56) References Cited

U.S. PATENT DOCUMENTS

| | | | | |
|---|---|---|---|---|
| 5,278,788 A | * | 1/1994 | Nomura ................. | 365/189.14 |
| 5,745,432 A | * | 4/1998 | McClure ................. | 365/230.06 |
| 5,841,730 A | * | 11/1998 | Kai et al. ............... | 365/189.16 |
| 6,104,666 A | | 8/2000 | Kumar | |
| 7,596,040 B2 | * | 9/2009 | Tokito ........................ | 365/190 |

FOREIGN PATENT DOCUMENTS

| | | |
|---|---|---|
| JP | 6-195977 | 7/1994 |
| JP | 2004-348836 | 12/2004 |
| KR | 2003-23334 | 3/2003 |

* cited by examiner

*Primary Examiner*—Anh Phung
(74) *Attorney, Agent, or Firm*—Stanzione & Kim, LLP

(57) ABSTRACT

A write driver circuit of a semiconductor memory to provide an unmuxed bit line scheme which reduces a height of an unmuxed Y-path so as to reduce an area of a chip in the memory. The write driver circuit can include an input latch circuit which latches input data, in response to an input enable signal; a first write driver which receives write data output from the input latch circuit, in response to a write enable signal, and outputs data to a bit line; and a second write driver which receives inverse data of the write data output from the input latch circuit, in response to the write enable signal, and outputs data to a complementary bit line, wherein the first and second write drivers have a NAND gate type structure and function as a write driver and a precharge driver.

11 Claims, 4 Drawing Sheets

WRITE DRIVER CIRCUIT OF AN UNMUXED BIT LINE SCHEME

CROSS-REFERENCE TO RELATED APPLICATIONS

This application claims the benefit of Korean Patent Application No. 10-2007-0077809, filed on Aug. 2, 2007, in the Korean Intellectual Property Office, the disclosure of which is incorporated herein in its entirety by reference.

BACKGROUND OF THE INVENTION

1. Field of the Invention

The present general inventive concept relates to a semiconductor memory, and more particularly, to a write driver circuit of a semiconductor memory having an unmuxed bit line scheme.

2. Description of the Related Art

In general, a memory supporting wide Bit Per Word (BPW) has a fat structure. In particular, in case of a register file memory mainly used for replacing a register array of a System On Chip (SOC), the area of the register file memory tends to be fat during designing of a chip. It is important to reduce the height of a memory, instead of the width, in a fat-type memory for reducing the area of a chip in a memory.

Meanwhile, a memory supporting wide BPW requires an unmixed bit line structure and an unmixed Y-path (also referred to as "unmuxed"). Here, the unmuxed Y-path refers to a path including circuits relating to output paths (that is, a sense amplifier, an output latch, and an output buffer) and circuits relating to input paths (that is an input buffer, an input latch, and a write driver) in each column.

That is, the unmuxed Y-path maximizes bandwidth for reading out/writing data existing in a number of bit lines at the same time, instead of for selectively reading out/writing data existing in the bit lines selected from among a number of bit lines through a multiplexer (MUX). Accordingly, if n (n is a natural number) columns exist, n Y-paths are needed.

However, as mentioned above, such an unmuxed Y-path should include all circuits relating to output paths (that is, a sense amplifier, an output latch, and an output buffer) and circuits relating to input paths (that is an input buffer, an input latch, and a write driver) in each column so that a height of the unmuxed Y-path is much higher than that of a control circuit block during designing of a chip. In particular, in the unmuxed Y-path, the write driver occupies a significantly large space. Thus, in order to reduce the area of a chip in the memory having the unmuxed Y-path, that is, an unmuxed bit line scheme, so as to reduce a cost of the memory, it is important to simplify the structure of the write driver circuit and thus reduce the area occupied by the write driver circuit, thereby reducing the height of the unmuxed Y-path.

SUMMARY OF THE INVENTION

The present general inventive concept provides a write driver circuit of a semiconductor memory which reduces a height of an unmuxed Y-path so as to reduce the area of a chip.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept are achieve by providing a write driver circuit of a semiconductor memory device, the write driver circuit including: an input latch circuit which latches input data, in response to an input enable signal; a first write driver which receives write data output from the input latch circuit, in response to a write enable signal, and outputs data to a bit line; and a second write driver which receives inverse data of the write data output from the input latch circuit, in response to the write enable signal, and outputs data to a complementary bit line, wherein the first and second write drivers have a NAND gate type structure.

The write driver circuit may further include an equalizer connected between the bit line and the complementary bit line which equalizes the bit line and the complementary bit line, in response to the write enable signal.

The first and second write drivers may precharge the bit line and the complementary bit line while disabling the write enable signal.

The input latch circuit may include: an inverting buffer which invert buffers the input data; and a latch unit which latches an output signal of the inverting buffer, in response to the input enable signal, and outputs the write data and inverse data of the write data.

The first write driver may include a NAND gate which receives the write enable signal and the write data to perform a NAND operation and outputs the result of the performance to the bit line. The second write driver may include a NAND gate which receives the write enable signal and inverse data of the write data to perform a NAND operation and outputs the result of the performance to the complementary bit line.

The foregoing and/or other aspects and utilities of the present general inventive concept are achieve by providing a write driver circuit of a semiconductor memory device, including an input latch circuit to latch input data, a first write driver to receive write data output from the input latch circuit and to output the write data to a bit line, and a second write driver to receive inverse data of the write data output from the input latch circuit and to output the inverse data to a complementary bit line.

BRIEF DESCRIPTION OF THE DRAWINGS

The above and other features and utilities of the present general inventive concept will become more apparent by describing in detail exemplary embodiments thereof with reference to the attached drawings in which.

DETAILED DESCRIPTION OF THE PREFERRED EMBODIMENTS

Figure 1:
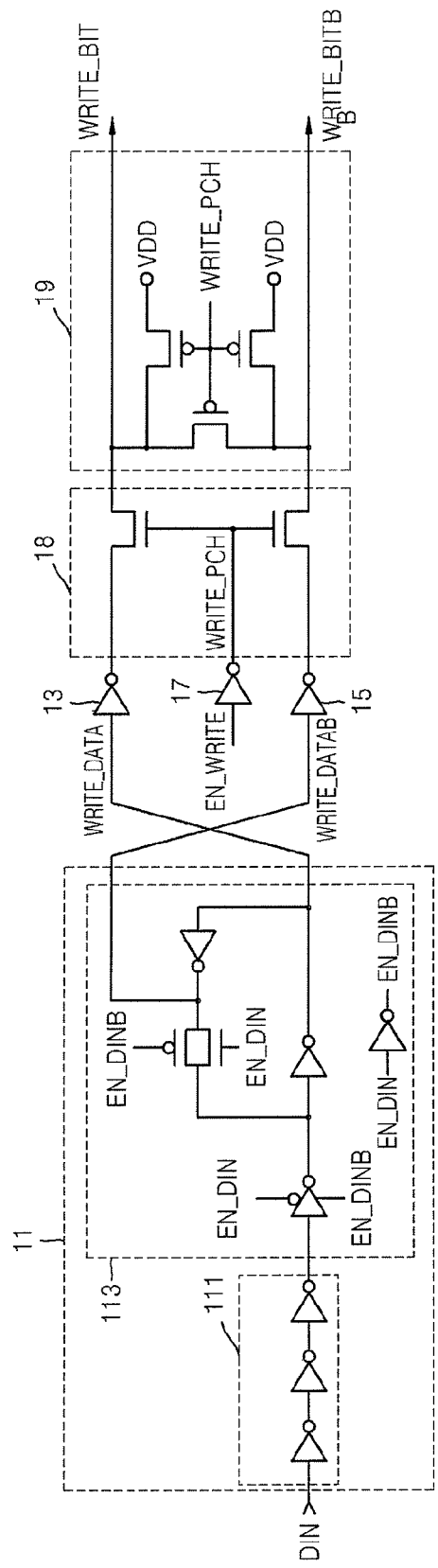
FIG. 1 is a circuit diagram illustrating a general write driver circuit for an unmuxed Y-path, that is, an unmuxed bit line scheme.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 2:
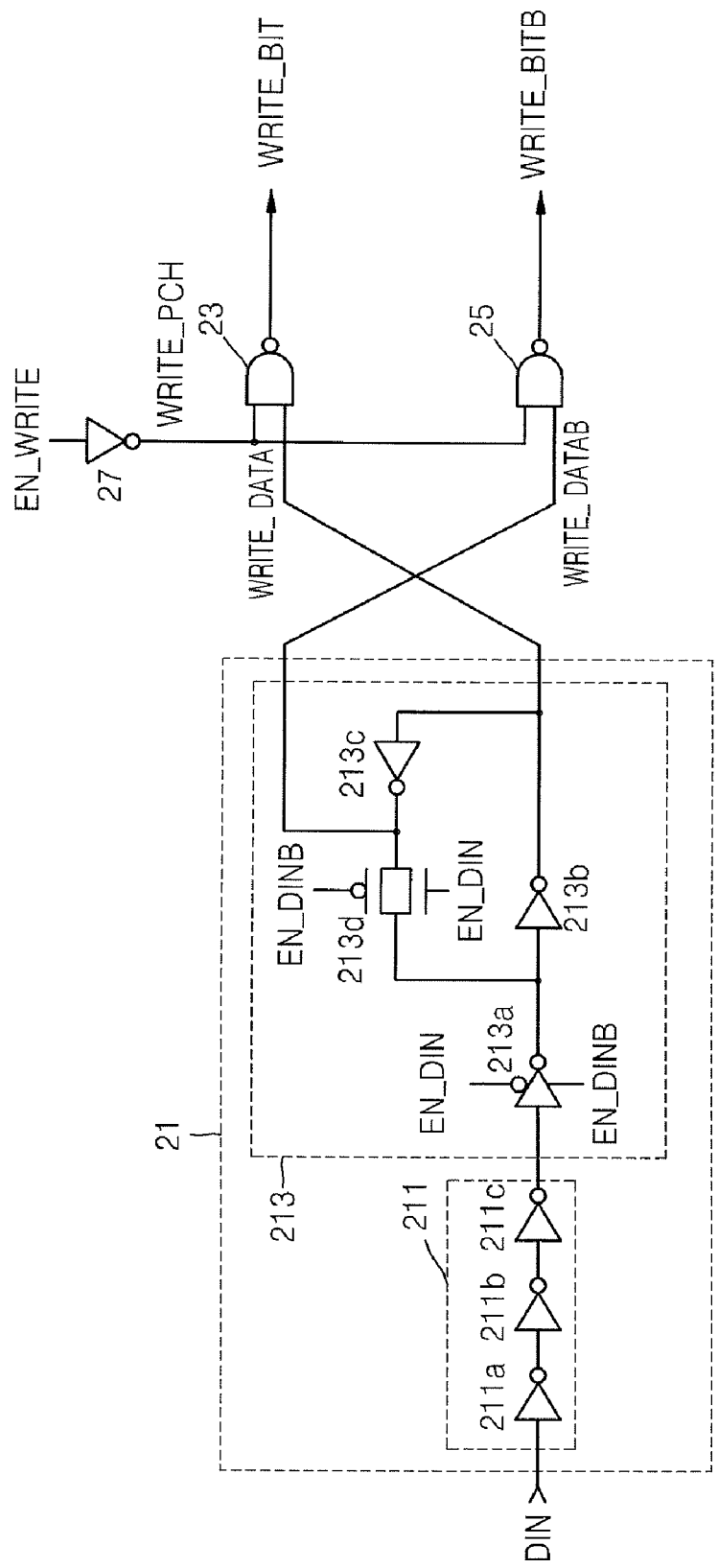
FIG. 2 is a circuit diagram illustrating a write driver circuit of an unmuxed bit line scheme according to an embodiment of the present general inventive concept.

FIG. 1 is a circuit diagram illustrating a general write driver circuit of an unmuxed Y-path, that is, an unmuxed bit line scheme. FIG. 2 is a circuit diagram illustrating a write driver circuit of an unmuxed bit line scheme according to an embodiment of the present general inventive concept. Before describing the write driver circuit according to an embodiment of the present general inventive concept as illustrated in FIG. 2, the general write driver circuit of FIG. 1 is described first for comparison between both write driver circuits.

Referring to FIG. 1, the general write driver circuit for the unmuxed bit line scheme includes an input latch circuit 11, a first write driver 13, and a second write driver 15, wherein the input latch circuit 11 responds to an input enable signal EN_DIN and latches input data DIN, the first write driver 13 receives write data WRITE_DATA output from the input latch circuit 11 and buffers the data, and the second write driver 15 receives inverse data WRITE_DATAB of the write data output from the input latch circuit 11 and buffers the data. The first write driver 13 and the second write driver 15 are formed inverter-type write drivers.

In addition, in order to prevent a malfunction of an unselected bit-line, the general write driver circuit for the unmuxed bit line scheme includes a multiplexer (MUX) 18 and a precharge circuit 19, wherein the MUX 18 is connected between the first and second write drivers 13 and 15 and a pair of bit-lines WRITE_BIT and WRITE_BITB and the precharge circuit 19 is connected between the bit-lines WRITE_BIT and WRITE_BITB.

The input latch circuit 11 includes an inverting buffer 111 and a latch unit 113, wherein the inverting buffer 111 inverts and buffers input data DIN and the latch unit 113 latches an output signal of the inverting buffer 111, in response to input enable signal EN_DIN, and outputs inverse data WRITE_DATAB of write data.

However, since the general write driver circuit includes the MUS 18 and the precharge circuit 19, the area of the write driver circuit is large. Accordingly, the height of the unmuxed Y-path including the general write driver circuit (18 and 19) is large, and thus the area of a chip of a memory block is also large.

A write driver circuit of an unmuxed bit line scheme according to an embodiment of the present general inventive concept is illustrated in FIG. 2, and will be described more in detail below, while referring to FIG. 2.

Referring to FIG. 2, the write driver circuit of the unmuxed bit line scheme includes an input latch circuit 21, a first write driver 23, and a second write driver 25, wherein the input latch circuit 21 latches input data DIN in response to an input enable signal EN_DIN, the first write driver 23 receives write data WRITE_DATA output from the input latch circuit 21, in response to a write enable signal EN_WRITE, and buffers the write data WRITE_DATA, and the second write driver 25 receives inverse data WRITE_DATAB of the write data WRITE_DATA output from the input latch circuit 21, in response to the write enable signal EN_WRITE, and buffers the inverse data WRITE_DATAB.

The first write driver 23 and the second write driver 25 have a NAND gate type structure. In addition, the first write driver 23 and the second write driver 25 function as a write driver and a precharge driver. While enabling the write enable signal EN_WRITE (logic low), the first write driver 23 and the second write driver 25 respectively receive the write data WRITE_DATA and the inverse data WRITE_DATAB to buffer the data and output the data to the bit line WRITE_BIT and the complementary bit line WRITE_BITB. While disabling the write enable signal EN_WRITE, the first write driver 23 and the second write driver 25 precharge the bit line WRITE_BIT and the complementary bit line WRITE_BITB to a logic high. That is, when the operation is not a write operation, the first write driver 23 and the second write driver 25 precharge the bit line WRITE_BIT and the complementary bit line WRITE_BITB to a logic high.

The input latch circuit 21 includes an inverting buffer 211 and a latch unit 213, wherein the inverting buffer 211 inverse buffers the input data DIN and latches an output signal of the inverting buffer 211, in response to the input enable signal EN_DIN, and outputs write data WRITE_DATA and the inverse data WRITE_DATAB.

The inverting buffer 211 is formed of an odd number of inverters 211a-211c connected to each other in series. The latch unit 213 is formed of inverters 213a, 213b, and 213c, and a transmission gate 213d, wherein the inverters 213a, 213b, and 213c are controlled by the input enable signal EN_DIN and the complementary input enable signal EN_DINB and the transmission gate 213d is formed of the input enable signal EN_DIN and the complementary input enable signal EN_DINB.

As described above, in the write driver circuit of FIG. 2 according to the current embodiment, the MUX 18 and the precharge circuit 19 included in the general write driver circuit of FIG. 1 are not required. In addition, unlike the general write driver circuit of FIG. 1, the first write driver 23 and the second write driver 25 in a NAND gate type structure, instead of an inverter type structure, are used in the write driver circuit of FIG. 2.

Accordingly, the area of the write driver circuit of FIG. 2 is smaller than the area of a write driver circuit of the related art so that the height of the unmuxed Y-path decreases and the area of a chip of a memory block is reduced. In addition, since the MUX 18 is not required, data transmission capability is increased and thus data transmission speed becomes faster.

Figure 3:
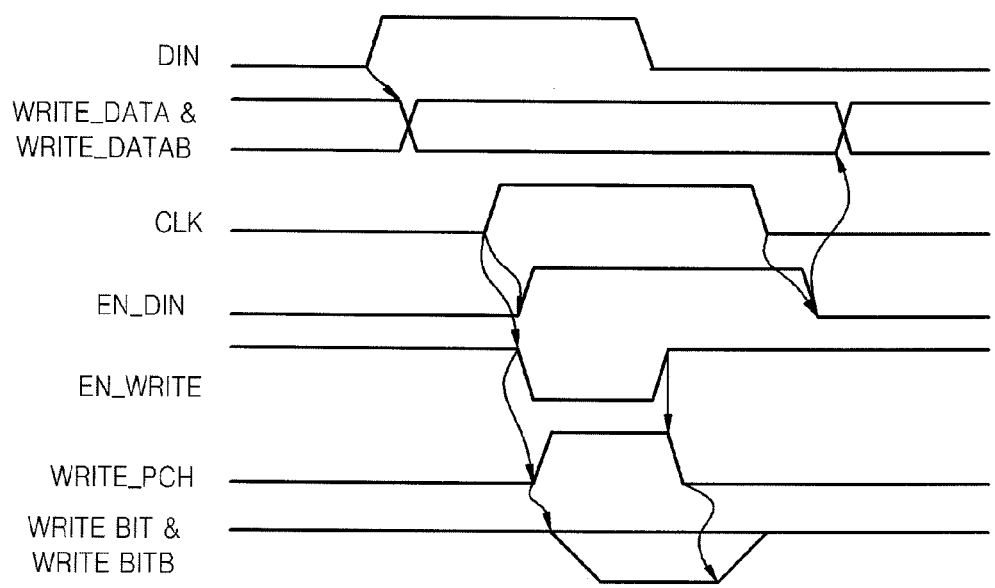
FIG. 3 is an operational timing diagram of the write driver circuit illustrated in FIG. 2.

FIG. 3 is an operational timing diagram of the write driver circuit illustrated in FIG. 2. Referring to FIG. 3, when the input data DIN is applied to the write driver circuit before applying a clock signal CLK, the input data DIN is loaded to the write data WRITE_DATA through the input latch circuit 21 and inverse data of DIN is loaded to the inverse data WRITE_DATAB. Then, when the clock signal CLK is applied, the input data DIN is stored in the latch unit 213 in response to the input enable signal EN_DIN. Simultaneously, the write enable signal EN_WRITE becomes a logic low so that a precharge operation is stopped and the write data WRITE_DATA and inverse data WRITE_DATAB are inverse buffered through the first write driver 23 and the second write driver 25 so as to be output as the bit line WRITE_BIT and the complementary bit line WRITE_BITB.

Figure 4:
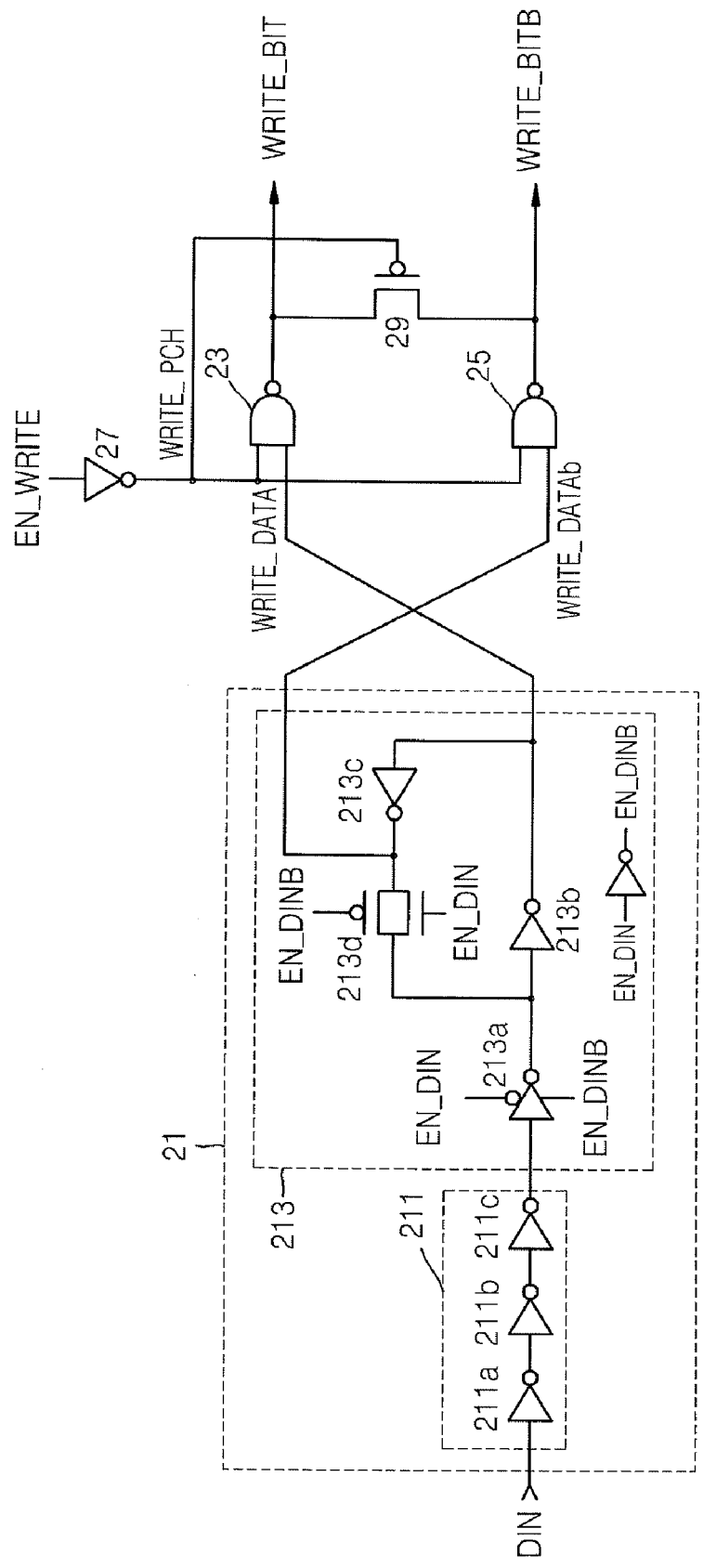
FIG. 4 is a circuit diagram illustrating a write driver circuit of an unmuxed bit line scheme according to another embodiment of the present general inventive concept.

FIG. 4 is a circuit diagram illustrating a write driver circuit for an unmuxed bit line scheme according to another embodiment of the present general inventive concept.

Referring to FIG. 4, the write driver circuit according to another embodiment further includes an equalizer 29 connected between the bit line WRITE_BIT and the complementary bit line WRITE_BITB, as compared with the write driver circuit according to the embodiment of FIG. 2.

Here, the equalizer 29 is formed of a PMOS transistor. The equalizer 29 equalizes the bit line WRITE_BIT and the complementary bit line WRITE_BITB when the write enable signal EN_WRITE is a logic high (that is, when the operation is not a write operation).

The equalizer 29 is to improve a precharge speed of the bit line WRITE_BIT and the complementary bit line WRITE_BITB without increasing an area of the write driver circuit. That is, in the write driver circuit of FIG. 2 according to the previous embodiment, the size of a PMOS transistor of the NAND gate type first write driver 23 and second write driver 25 is of a predetermined size in order to reduce the precharging time. However, in the write driver circuit of FIG. 4 according to the current embodiment, the equalizer 29 to improve a precharge speed is further included so that the size of the PMOS transistor of the first write driver 23 and the second write driver 25 can be reduced and the size of an NMOS transistor of the first write driver 23 and the second write driver 25 can also be reduced.

Accordingly, in the write driver circuit of FIG. 4 according to the current embodiment, the area thereof can be further reduced without decreasing a precharge speed, as compared with the write driver circuit of FIG. 2 according to the previous embodiment.

The detailed operations of the write driver circuit illustrated in the embodiment of FIG. 4 are similar to those of the write driver circuit illustrated in the embodiment of FIG. 2, and thus an operational timing diagram of the write driver circuit of FIG. 4 is not illustrated. The basic operations of the write driver circuit of FIG. 4 are similar to those of the write driver circuit of FIG. 2, except that a precharge speed is further increased by the equalizer 29, and the size of the PMOS transistor of the first write driver 23 and the second write driver 25 is reduced, thereby further increasing a write speed to some extent in the write driver circuit of FIG. 4 as compared to the write driver circuit of FIG. 2.

As described above, in write driver circuits of an unmuxed bit line scheme according to embodiments of the present general inventive concept, a NAND gate type write driver is used, and thus a MUX and a precharge circuit generally in a write driver circuit are not required. Accordingly, an area of the write driver circuit is reduced and a height of the unmixed Y-path decreases and the area of a chip of a memory block is reduced. Moreover, since the MUX is not required, data transmission capability is improved and data transmission speed becomes faster (with respect to write driver circuits used in the related art.

While the present general inventive concept has been particularly illustrated and described with reference to exemplary embodiments thereof, it will be understood by those of ordinary skill in the art that various changes in form and details may be made therein without departing from the spirit and scope of the present general inventive concept as defined by the following claims.

What is claimed is:

1. A write driver circuit of a semiconductor memory device, the write driver circuit comprising:
   an input latch circuit to latch input data, in response to an input enable signal;
   a first write driver to receive write data output from the input latch circuit, in response to a write enable signal, and to output data to a bit line; and
   a second write driver to receive inverse data of the write data output from the input latch circuit, in response to the write enable signal, and to output data to a complementary bit line,
   wherein the first and second write drivers have a NAND gate type structure.

2. The write driver circuit of claim 1, wherein the first and second write drivers precharge the bit line and the complementary bit line while disabling the write enable signal.

3. The write driver circuit of claim 1, wherein the input latch circuit comprises:
   an inverting buffer to invert buffer the input data; and
   a latch unit to latch an output signal of the inverting buffer, in response to the input enable signal, and to output the write data and inverse data of the write data.

4. The write driver circuit of claim 1, wherein the first write driver comprises a NAND gate to receive the write enable signal and the write data to perform a NAND operation and to output the result of the performance to the bit line.

5. The write driver circuit of claim 1, wherein the second write driver comprises a NAND gate to receive the write enable signal and inverse data of the write data to perform a NAND operation and to output the result of the performance to the complementary bit line.

6. The write driver circuit of claim 1, further comprising:
   an equalizer connected between the bit line and the complementary bit line to equalize the bit line and the complementary bit line, in response to the write enable signal.

7. The write driver circuit of claim 6, wherein the equalizer is formed of a MOS type transistor.

8. A write driver circuit of a semiconductor memory device, comprising:
   an input latch circuit to latch input data;
   a first write driver to receive write data output from the input latch circuit and to output the write data to a bit line; and
   a second write driver to receive inverse data of the write data output from the input latch circuit and to output the inverse data to a complementary bit line.

9. The write driver circuit of claim 8, further comprising:
   an equalizer connected between the bit line and the complementary bit line to equalize the bit line and the complementary bit line, in response to a write enable signal.

10. The write driver circuit of claim 8, wherein the first write driver and the second write driver are formed of a gate type structure.

11. The write driver circuit of claim 10, wherein the gate type structure is a NAND gate.

* * * * *